(12) United States Patent
Pavlov

(10) Patent No.: US 12,388,452 B2
(45) Date of Patent: Aug. 12, 2025

(54) SYSTEMS AND METHODS FOR DUTY CYCLE COMPENSATION OF A DIGITAL TO ANALOG CONVERTER (DAC)

(71) Applicant: D-WAVE SYSTEMS INC., Burnaby (CA)

(72) Inventor: Igor Pavlov, Burnaby (CA)

(73) Assignee: 1372934 B.C. LTD., Burnaby (CA)

( * ) Notice: Subject to any disclaimer, the term of this patent is extended or adjusted under 35 U.S.C. 154(b) by 206 days.

(21) Appl. No.: 17/958,691

(22) Filed: Oct. 3, 2022

(65) Prior Publication Data

US 2023/0138924 A1     May 4, 2023

Related U.S. Application Data

(60) Provisional application No. 63/275,068, filed on Nov. 3, 2021.

(51) Int. Cl.
| | |
|---|---|
| *H03M 1/06* | (2006.01) |
| *G06N 10/60* | (2022.01) |
| *H03M 1/08* | (2006.01) |
| *H03M 1/66* | (2006.01) |

(52) U.S. Cl.
CPC .......... *H03M 1/0604* (2013.01); *G06N 10/60* (2022.01); *H03M 1/089* (2013.01); *H03M 1/66* (2013.01)

(58) Field of Classification Search
CPC ...... H03M 1/0604; H03M 1/089; H03M 1/66; G06N 10/60
USPC ........................................................ 341/119
See application file for complete search history.

(56) References Cited

U.S. PATENT DOCUMENTS

| | | | |
|---|---|---|---|
| 2,832,897 A | 4/1958 | Buck | |
| 2,865,006 A | 12/1958 | Samuel | |
| 3,200,368 A | 8/1965 | Stekly et al. | |
| 3,267,396 A | 8/1966 | James | |
| 3,380,004 A | 4/1968 | Hansen | |
| 3,753,168 A | 8/1973 | Schor | |
| 3,766,502 A | 10/1973 | Bronca et al. | |
| 3,783,417 A | 1/1974 | Osada et al. | |
| 4,028,714 A | 6/1977 | Henkels | |
| 4,275,314 A | 6/1981 | Fulton | |
| 4,342,013 A | 7/1982 | Kallman | |

(Continued)

FOREIGN PATENT DOCUMENTS

| | | |
|---|---|---|
| CA | 2379144 A1 | 2/2001 |
| CA | 2386426 A1 | 5/2001 |

(Continued)

OTHER PUBLICATIONS

Levinson, "Principles of Lithography", The International Society for Optical Engineering, Bellingham, WA, 2001. (book details provided).

(Continued)

*Primary Examiner* — Khai M Nguyen
(74) *Attorney, Agent, or Firm* — Cozen O'Connor

(57) ABSTRACT

A temperature stabilization technique for a digital-to-analog converter (DAC). The DAC is kept operating while a load, for example an analog computer, is disconnected from the DAC in order to reduce temperature changes that otherwise occur when the DAC is idle. The DAC may be supplied with adjusted input to compensate for changes in dissipation caused by the removal of the load.

18 Claims, 5 Drawing Sheets

(56) References Cited

U.S. PATENT DOCUMENTS

| | | | |
|---|---|---|---|
| 4,453,144 A | 6/1984 | Tamura et al. |
| 4,464,640 A | 8/1984 | Nishikawa et al. |
| 4,496,854 A | 1/1985 | Chi et al. |
| 4,707,184 A | 11/1987 | Hashiguchi et al. |
| 4,731,611 A | 3/1988 | Mueller et al. |
| 4,761,623 A | 8/1988 | Schneider |
| 4,781,969 A | 11/1988 | Kobayashi et al. |
| 4,797,596 A | 1/1989 | Tsuzurahara |
| 4,937,525 A | 6/1990 | Daalmans |
| 4,943,792 A | 7/1990 | Srivastava et al. |
| 4,947,118 A | 8/1990 | Fujimaki |
| 4,952,896 A | 8/1990 | Dawson |
| 4,956,642 A | 9/1990 | Harada |
| 4,983,971 A | 1/1991 | Przybysz et al. |
| 5,083,101 A | 1/1992 | Frederick |
| 5,128,675 A | 7/1992 | Harada |
| 5,146,191 A | 9/1992 | Mandai et al. |
| 5,150,086 A | 9/1992 | Ito |
| 5,162,731 A | 11/1992 | Fujimaki |
| 5,173,660 A | 12/1992 | Marsden |
| 5,227,365 A | 7/1993 | Van |
| 5,248,941 A | 9/1993 | Lee et al. |
| 5,307,068 A | 4/1994 | Hartemann |
| 5,313,176 A | 5/1994 | Upadhyay |
| 5,319,343 A | 6/1994 | Jeffries |
| 5,365,476 A | 11/1994 | Mukhanov |
| 5,392,012 A | 2/1995 | Iwata et al. |
| 5,398,030 A | 3/1995 | Sandell |
| 5,446,427 A | 8/1995 | Nakayama et al. |
| 5,616,539 A | 4/1997 | Hey-Shipton et al. |
| 5,618,777 A | 4/1997 | Hey-Shipton et al. |
| 5,831,489 A | 11/1998 | Wire |
| 5,869,846 A | 2/1999 | Higashino et al. |
| 5,917,066 A | 6/1999 | Eisenmann et al. |
| 5,936,458 A | 8/1999 | Rylov |
| 5,937,263 A | 8/1999 | Eisenmann et al. |
| 5,939,955 A | 8/1999 | Chen et al. |
| 5,974,335 A | 10/1999 | Talisa et al. |
| 5,982,219 A | 11/1999 | Kirichenko |
| 6,026,311 A | 2/2000 | Willemsen et al. |
| 6,094,110 A | 7/2000 | Reddy |
| 6,114,931 A | 9/2000 | Gevorgian et al. |
| 6,347,237 B1 | 2/2002 | Eden et al. |
| 6,373,294 B1 | 4/2002 | Bentley |
| 6,627,916 B2 | 9/2003 | Amin et al. |
| 6,686,811 B2 | 2/2004 | Hey-Shipton |
| 6,784,451 B2 | 8/2004 | Amin et al. |
| 6,825,748 B1 | 11/2004 | Ibata et al. |
| 6,838,694 B2 | 1/2005 | Esteve et al. |
| 6,898,450 B2 | 5/2005 | Eden et al. |
| 6,984,846 B2 | 1/2006 | Newns et al. |
| 7,129,870 B2 | 10/2006 | Hirano et al. |
| 7,133,888 B2 | 11/2006 | Kohn et al. |
| 7,145,415 B2 | 12/2006 | Sengupta et al. |
| 7,164,331 B2 | 1/2007 | Reddy |
| 7,335,909 B2 | 2/2008 | Amin et al. |
| 7,365,663 B2 | 4/2008 | Rylov et al. |
| 7,456,702 B2 | 11/2008 | Keefe et al. |
| 7,477,060 B2 | 1/2009 | Yu et al. |
| 7,533,068 B2 | 5/2009 | Maassen et al. |
| 7,619,437 B2 | 11/2009 | Thom et al. |
| 7,624,088 B2 | 11/2009 | Johnson et al. |
| 7,733,253 B2 | 6/2010 | Kirichenko |
| 7,791,430 B2 | 9/2010 | Keefe et al. |
| 7,800,395 B2 | 9/2010 | Johnson et al. |
| 7,843,209 B2 | 11/2010 | Berkley |
| 7,859,364 B2 | 12/2010 | Sakisaka et al. |
| 7,876,248 B2 | 1/2011 | Berkley et al. |
| 7,990,662 B2 | 8/2011 | Berkley et al. |
| 8,008,991 B2 | 8/2011 | Tcaciuc et al. |
| 8,073,808 B2 | 12/2011 | Rose |
| 8,098,169 B2 | 1/2012 | Abraham et al. |
| 8,098,179 B2 | 1/2012 | Bunyk et al. |
| 8,159,313 B2 | 4/2012 | Uchaykin |
| 8,169,231 B2 | 5/2012 | Berkley |
| 8,179,133 B1 | 5/2012 | Kornev et al. |
| 8,190,548 B2 | 5/2012 | Choi |
| 8,195,596 B2 | 6/2012 | Rose et al. |
| 8,228,688 B2 | 7/2012 | Uchaykin et al. |
| 8,244,650 B2 | 8/2012 | Rose |
| 8,247,799 B2 | 8/2012 | Bunyk et al. |
| 8,279,022 B2 | 10/2012 | Thom et al. |
| 8,315,678 B2 | 11/2012 | Uchaykin |
| 8,346,325 B2 | 1/2013 | Thom et al. |
| 8,421,053 B2 | 4/2013 | Bunyk et al. |
| 8,436,354 B2 | 5/2013 | Aoki et al. |
| 8,441,329 B2 | 5/2013 | Thom et al. |
| 8,441,330 B2 | 5/2013 | Uchaykin |
| 8,604,669 B2 | 12/2013 | Hsieh et al. |
| 8,745,850 B2 | 6/2014 | Farinelli et al. |
| 8,772,759 B2 | 7/2014 | Bunyk et al. |
| 8,786,476 B2 | 7/2014 | Bunyk et al. |
| 8,854,704 B2 | 10/2014 | Takahashi |
| 8,933,695 B1 | 1/2015 | Kornev et al. |
| 9,098,272 B2* | 8/2015 | Steinbusch ........... G06F 1/3287 |
| 9,100,757 B2* | 8/2015 | Johnson ............... H04R 29/001 |
| 9,154,151 B1 | 10/2015 | Leong |
| 9,170,278 B2 | 10/2015 | Neufeld |
| 9,231,181 B2 | 1/2016 | Thom et al. |
| 9,300,029 B2 | 3/2016 | Abraham et al. |
| 9,406,026 B2 | 8/2016 | Bunyk et al. |
| 9,465,401 B2 | 10/2016 | Uchaykin |
| 9,779,360 B2 | 10/2017 | Bunyk et al. |
| 10,003,217 B2 | 6/2018 | Kuerschner et al. |
| 10,528,886 B2 | 1/2020 | Boothby |
| 10,734,569 B2 | 8/2020 | Goto |
| 11,127,893 B2 | 9/2021 | Johnson et al. |
| 2001/0025012 A1 | 9/2001 | Tarutani et al. |
| 2003/0016069 A1 | 1/2003 | Furuta et al. |
| 2003/0071258 A1 | 4/2003 | Zagoskin et al. |
| 2003/0224753 A1 | 12/2003 | Bremond et al. |
| 2005/0007096 A1 | 1/2005 | Dimino et al. |
| 2005/0047245 A1 | 3/2005 | Furuta et al. |
| 2005/0082519 A1 | 4/2005 | Amin et al. |
| 2005/0104683 A1 | 5/2005 | Cortes et al. |
| 2005/0184829 A1 | 8/2005 | Yoshimoto et al. |
| 2005/0250651 A1 | 11/2005 | Amin et al. |
| 2005/0256007 A1 | 11/2005 | Amin et al. |
| 2006/0147154 A1 | 7/2006 | Thom et al. |
| 2006/0225165 A1 | 10/2006 | Maassen et al. |
| 2006/0248618 A1 | 11/2006 | Berkley |
| 2007/0052441 A1 | 3/2007 | Taguchi et al. |
| 2008/0176750 A1 | 7/2008 | Rose et al. |
| 2008/0176751 A1 | 7/2008 | Tcaciuc et al. |
| 2008/0215850 A1 | 9/2008 | Berkley et al. |
| 2008/0238531 A1 | 10/2008 | Harris |
| 2008/0258849 A1 | 10/2008 | Keefe et al. |
| 2008/0284545 A1 | 11/2008 | Keefe et al. |
| 2009/0075825 A1 | 3/2009 | Rose et al. |
| 2009/0078931 A1 | 3/2009 | Berkley |
| 2009/0082209 A1 | 3/2009 | Bunyk et al. |
| 2009/0102580 A1 | 4/2009 | Uchaykin |
| 2009/0121215 A1 | 5/2009 | Choi |
| 2009/0122508 A1 | 5/2009 | Uchaykin et al. |
| 2009/0146599 A1 | 6/2009 | Zhou et al. |
| 2009/0168286 A1 | 7/2009 | Berkley et al. |
| 2009/0206871 A1 | 8/2009 | Baumgardner et al. |
| 2009/0241013 A1 | 9/2009 | Roetteler |
| 2009/0267635 A1 | 10/2009 | Herr et al. |
| 2009/0319757 A1 | 12/2009 | Berkley |
| 2010/0157522 A1 | 6/2010 | Refai-Ahmed |
| 2010/0157552 A1 | 6/2010 | Thom et al. |
| 2011/0022820 A1 | 1/2011 | Bunyk et al. |
| 2011/0065586 A1 | 3/2011 | Maibaum et al. |
| 2011/0089405 A1 | 4/2011 | Ladizinsky et al. |
| 2011/0094838 A1 | 4/2011 | Haack |
| 2011/0152104 A1 | 6/2011 | Farinelli et al. |
| 2011/0175061 A1 | 7/2011 | Berkley et al. |
| 2011/0183853 A1 | 7/2011 | Thom et al. |
| 2012/0088675 A1 | 4/2012 | Pires et al. |
| 2012/0094838 A1 | 4/2012 | Bunyk et al. |
| 2012/0135867 A1 | 5/2012 | Thom et al. |
| 2014/0137571 A1 | 5/2014 | Petroff et al. |
| 2014/0326001 A1 | 11/2014 | Citver et al. |

(56) References Cited

U.S. PATENT DOCUMENTS

| | | |
|---|---|---|
| 2015/0032994 A1 | 1/2015 | Chudak et al. |
| 2015/0092465 A1 | 4/2015 | Herr et al. |
| 2015/0263260 A1 | 9/2015 | Thom et al. |
| 2015/0276827 A1 | 10/2015 | Sharma et al. |
| 2016/0085616 A1 | 3/2016 | Berkley |
| 2016/0112031 A1 | 4/2016 | Abraham et al. |
| 2016/0121203 A1 | 5/2016 | Gomez et al. |
| 2016/0267032 A1 | 9/2016 | Rigetti et al. |
| 2017/0091648 A1 | 3/2017 | Abdo |
| 2017/0146579 A1 | 5/2017 | Beaty et al. |
| 2017/0162778 A1 | 6/2017 | Harris et al. |
| 2017/0178018 A1 | 6/2017 | Tcaciuc et al. |
| 2017/0269146 A1 | 9/2017 | Regau |
| 2018/0145631 A1 | 5/2018 | Berkley et al. |
| 2018/0321339 A1 | 11/2018 | Yang et al. |
| 2018/0336299 A1 | 11/2018 | Barzegar et al. |
| 2020/0050961 A1 | 2/2020 | Abdo |
| 2020/0083423 A1 | 3/2020 | Gota |
| 2021/0057631 A1 | 2/2021 | Swenson et al. |
| 2021/0190885 A1 | 6/2021 | Swenson et al. |
| 2022/0103172 A1 | 3/2022 | Mundhada et al. |
| 2023/0142878 A1 | 5/2023 | Yamaji |

FOREIGN PATENT DOCUMENTS

| | | |
|---|---|---|
| CN | 1470883 A | 1/2004 |
| CN | 101088102 A | 12/2007 |
| CN | 101868802 A | 12/2013 |
| CN | 107580752 A | 1/2018 |
| CN | 107924982 A | 4/2018 |
| CN | 107925146 A | 4/2018 |
| DE | 1927825 A1 | 12/1970 |
| DE | 4119880 A1 | 1/1993 |
| EP | 0148479 A2 | 7/1985 |
| EP | 0707349 A1 | 4/1996 |
| JP | 51-084591 | 7/1976 |
| JP | 63226981 A | 9/1988 |
| JP | H05114756 A | 5/1993 |
| JP | 2001345488 A | 12/2001 |
| JP | 2002374107 A | 12/2002 |
| JP | 2007074120 A | 3/2007 |
| JP | 2010187240 A | 8/2010 |
| JP | 2011524043 A | 8/2011 |
| JP | 2012519379 A | 8/2012 |
| JP | 2016538809 A | 12/2016 |
| JP | 2019521546 A | 7/2019 |
| SU | 539333 A1 | 12/1976 |
| WO | 9609654 A1 | 3/1996 |
| WO | 2005093649 A1 | 10/2005 |
| WO | 2006043879 A1 | 4/2006 |
| WO | 2006066415 A1 | 6/2006 |
| WO | 2007085074 A1 | 8/2007 |
| WO | 2008029815 A1 | 3/2008 |
| WO | 2008138150 A1 | 11/2008 |
| WO | 2009039634 A1 | 4/2009 |
| WO | 2009120638 A2 | 10/2009 |
| WO | 2009149086 A2 | 12/2009 |
| WO | 2010028183 A2 | 3/2010 |
| WO | 2013190263 A1 | 12/2013 |
| WO | 2016183213 A1 | 11/2016 |
| WO | 2017055946 A1 | 4/2017 |
| WO | 2017074386 A1 | 5/2017 |
| WO | 2017115008 A1 | 7/2017 |
| WO | 2017192733 A2 | 11/2017 |
| WO | 2018055472 A1 | 3/2018 |
| WO | 2018106942 A1 | 6/2018 |
| WO | 2022140165 A1 | 6/2022 |

OTHER PUBLICATIONS

Levitov, et al., "Quantum Spin Chains and Majorana States in Arrays of Coupled Qubits," arXiv:cond-mat/0108266v2 [cond-mat.mes-hall]. Aug. 19, 2001, 7 pages.

Likharev et al., "RSFQ logic/memory family: a new Josephson-junction technology for sub-terahertz-clock-frequency digital systems"; IEEE Transactions on Applied Superconductivity; vol. 1, No. 1; Mar. 1991.

Likharev et al., "Reversible Conveyer Computation in Array of Parametric Quantrons," IEEE Transactions on Magnetics MAG-21(2):947-950, 1985.

Likharev, "Classical and Quantum Limitations on Energy Consumption in Computation," International Journal of Theoretical Physics 21(3/4):311-326, 1982.

Likharev, "Dynamics of Some Single Flux Quantum Devices: I. Parametric Quatron," IEEE Transactions on Magnetics MAG-13(1):242-244, 1977.

Lukashenko et al., "Improved powder filters for qubit measurements", Review of Scientific Instruments 79(014701): 1-4, 2001.

Maasen van den Brink et al., "Mediated Tunable Coupling of Flux Qubits," New Journal of Physics 7(230) 2005, 19 pages.

Madou, Fundamentals of Microfabrication, Second Edition, CRC Press LLC, Boca Raton, Florida, 2002. (book details provided).

Makhlin et al., "Quantum-state engineering with Josephson-junction devices," Reviews of Modern Physics 73 (2):357-400, Apr. 2001.

Mc Hugh et al., "A quantum computer using a trapped-ion spin molecule and microwave radiation," arXiv:quant-ph/0310015v2, pp. 1-9, Apr. 13, 2004.

Milliken, F.P. et al., "50 Q Characteristic Impedance Low-Pass Metal Powder Filters," Review of Scientific Instruments vol. 78, 2007, 6 pages.

Mizugaki et al., "Single-flux-quantum pump based on a three-junction superconducting quantum interference device", Applied Physics Letters, vol. 80(24), Jun. 17, 2002, 3 pages.

Mooij et al., "Josephson Persistent-Current Qubit," Science 285:1036-1039, Aug. 13, 1999.

Mueller, et al., "Printed Circuit Board Metal Powder Filters for Low Electron Temperatures", ArXiv:1304.3306, Apr. 11, 2013, 13 pages.

Naaman et al., "On-Chip Josephson Junction Microwave Switch," Northrop Grumman Systems Corp., Baltimore, Maryland, USA, Dec. 7, 2015, 10 pages.

Naaman, O. et al., "On-Chip Josephson Junction Microwave Switch," arXiv:1512.01484v1 [cond-mat.supr-con] Dec. 4, 2015, 10 pages.

Nielsen et al., Quantum Computation and Quantum Information, Cambridge University Press, Cambridge, 2000, "7.8 Other implementation schemes," pp. 343-345.

Nielsen, "Cluster-State Quantum Computation," arXiv:quant-ph/0504097v2, pp. 1-15, Jul. 1, 2005.

Orlando et al., "Superconducting persistent-current qubit," Physical Review B 60(22):15398-15413, Dec. 1, 1999.

Partanen et al., "Flux-tunable heat sink for quantum electric circuits", ArXiv:1712.10256, Dec. 29, 2017.

Pechal et al., "Superconducting Switch for Fast On-Chip Routing of Quantum Microwave Fields," arXiv:1606.01031v1 [quant-ph] Jun. 3, 2016, 8 pages.

Plourde et al., "Entangling Flux Qubits with a Bipolar Dynamic Inductance," Physical Review B 70, arXiv:quant-ph/0406049v1, Jun. 8, 2004, 4 pages.

Poulin et al., "A Superconducting Microwave Switch," IEEE Transactions on Applied Superconductivity 5(2):3046-3048, 1995.

Powell et al., "Thermal Conductivity of Metals and Alloys at Low Temperatures", National Bureau of Standards Circular 556, Sep. 1, 1954.

Rose et al., "Systems, Devices and Methods for Interconnected Processor Topology," U.S. Appl. No. 12/013,192, filed Jan. 11, 2008, 47 pages.

Ryan et al., "Characterization of complex quantum dynamics with a scalable NMR information processor," arXiv:quant-ph/0506085v2, pp. 1-4, Feb. 13, 2006.

Santavicca et al., "Impedance-Matched Low-Pass Stripline Filters," arXiv:0802.1343 [physics.ins-det] 2008, 9 pages.

Shabani et al., "Artificial Quantum Thermal Bath: Engineering Temperature for a Many-Body Quantum System," arXiv:1510.04354v2 [quant-ph] Nov. 4, 2016, 10 pages.

Shirts et al., "Computing: Screen Savers of the Word Unite!," Science Online 290(5498): 1903-1904, Dec. 8, 2000.

(56) References Cited

OTHER PUBLICATIONS

Shnirman et al., "Quantum Manipulations of Small Josephson Junctions," Physical Review Letters 79(12): 2371-2374, Sep. 22, 1997.
Shoji et al., "New fabrication process for Josephson tunnel junctions with (niobium nitride, niobium) double-layered electrodes," Appl. Phys. Lett. 41(11): 1097-1099, Dec. 1, 1982.
Shor, "Introduction to Quantum Algorithms," AT&T Labs—Research, arXiv:quant-ph/0005003 v2, pp. 1-17, Jul. 6, 2001.
Swenson et al., "Operation of a titanium nitride superconducting microresonator detector in the nonlinear regime," arXiv:1305.4281v1 [cond-mat.supr-con], May 18, 2013, 11 pages.
Thaker et al., "Quantum Memory Hierarchies: Efficient Designs to Match Available Parallelism in Quantum Computing," arXiv:quant-ph/0604070v1, 12 pages, Apr. 10, 2006.
Tuorila et al., "Efficient Protocol for Qubit Initialization with a Tunable Environment," arXiv:1612.04160v1 [cond-mat.mes-hall] Dec. 13, 2016, 17 pages.
Van Zant, "Microchip Fabrication", Fourth Edition, McGraw-Hill, New York, 2000. (book details provided).
Vlasov, "Von Neumann Quantum Processors," arXiv:quant-ph/0311196v1, pp. 1-8, Nov. 27, 2003.
Watanabe et al., "Resonance-Free Low-Pass Filters for the AC Josephson Voltage Standard," IEEE Transactions on Applied Superconductivity 16(1):49-53, 2006.
Whittaker, J.D. et al., "A Frequency and Sensitivity Tunable Microresonator Array for High-Speed Quantum Processor Readout," arXiv:1509.05811v2 [quant-ph], Apr. 22, 2016, 8 pages.
Williams, "Explorations in Quantum Computing", Springer, New York, Dec. 12, 1997, Chapter 11, "How to Make a Quantum Computer," pp. 241-265.
Wollack et al., "Impedance Matched Absorptive Thermal Blocking Filters," arXiv:1403.2909v1 [astro-ph.IM] Mar. 12, 2014, 5 pages.
Written Opinion for PCT/US2017/030857, mailed Jul. 24, 2017, 10 pages.
Written Opinion, mailed Mar. 18, 2008, for PCT/CA2007/002192, 5 pages.
X. Ning, "The development status and practical application prospects of superconducting technology" China Academia Journal Electronic Publishing House, HttP>//www.cnki.net, Application 2003, 3 pages.
Yeap, K.H. et al., "Attenuation in Superconducting Circular Waveguides," Advanced Electromagnetics vol. 5, No. 2, Sep. 2016, 5 pages.
Yoon, K., et al. "Atomic-Scale Chemical Analyses of Niobium Oxide/Niobium Interfaces via Atom-Probe Tomography," Applied Physics Letters, vol. 93, 2008, 3 pages.
Zorin, "The thermocoax cable as the microwave frequency filter for single electron circuits", Rev. Sci. Instrum. 66(8):4296-4300, Aug. 1995.
Whittaker, J.D. , et al., "A frequency and sensitivity tunable microresonator array for high-speed quantum," arXiv:1509.05811v2 [quant-ph], Apr. 22, 2016, 8 pages., Apr. 22, 2016.
Berkley, "A Josephson Junction Qubit", Dissertation University of Maryland, 2003.
Chapman et al., "General Purpose Multiplexing Device for Cryogenic Microwave Systems," arXiv:1603.02716v2 [quant-ph] May 31, 2016, 10 pages.
Chapman et al., "Widely Tunable On-Chip Microwave Circulator for Superconducting Quantum Circuits," Physical Review, vol. 7. 2017, 16 pages.
Jin et al., "Distributed microwave damping filters for superconducting quantum interference devices", Appl. Phys. Lett. 70(16):2186-2188, Apr. 21, 1997.
Notice of Reasons for Rejection dated Jun. 27, 2023, for Japanese Application No. 2022-564258, 6 pages.
Fry, "Understanding Temperature Drift in a Precision Digital-to-Analog Converter (DAC)", Maxim Integrated, Application Note 4672, May 10, 2012, 6 pages.
Ilichev, et al., "Continuous Monitoring of Rabi Oscillations in a Josephson Flux Qubit", Physical Review Letters 91(9):097906-1-097906-4, week ending Aug. 19, 2003.
Kher, et al., "Kinetic Inductance Parametric Up-Converter", Springer Science Business Media New York 2015, J Low Temp Phys (2016) 184:480-485, 6 pages.
Notice of Allowance for U.S. Appl. No. 16/996,595, mailed Aug. 2, 2023, 10 pages.
"A High-Level Look at Optimization: Past, Present and Future," e-Optimization.Community, May 2000, pp. 1-5.
Allen et al., "Blue Gene: A vision for protein science using a petaflop supercomputer," IBM Systems Journal 40(2):310-327, 2001.
Amin et al., "Thermally assisted adiabatic quantum computation," arXiv:cond-mat/0609332v2, pp. 1-5, Mar. 2, 2007.
Averin et al., "Variable Electrostatic Transformer: Controllable Coupling of Two Charge Qubits," Physical Review Letters 91(5): 057003-1-057003-4, Aug. 1, 2003.
B. H. Eom et al., "Wideband, Low-Noise Superconducting Amplifier with High Dynamic Range", arXiv:1201.2392v1 [cond-mat.supr-con], 2012, 23 pages.
Bladh et al., "Comparison of Cryogenic Filters for use in Single Electronics Experiments," Review of Scientific Instruments 74(3):1323-1327, 2003.
Blatter et al., "Design aspects of superconducting-phase quantum bits," Physical Review B 63: 174511-1-174511-9, 2001.
Berkley, et al., "A scalable readout system for a superconducting adiabatic quantum optimization system", arXiv, May 6, 2009, 18 pages.
Hioe, et al., "Quantum Flux Parametron"—A Single Quantum Flux Superconducting Logic Device, World Scientific Publishing Co. Pte. Ltd., Singapore, 1991, pp. 23-41.
Hosoya, Mutsumi , et al., "Operation of a 1-bit Quantum Flux Parametron shift register (latch) by 4-phase 36-GHz clock", IEEE Transactions on Applied Superconductivity, vol. 5, No. 2, 1995, pp. 2831-2834.
Inokuchi , "Analog Computation Using Quantum-Flux Parametron Devices," Physica C 357-360 :1618-1621, 2001.
Maibaum, et al., Systems, Methods and Apparatus for Superconducting Demultiplexer Circuits, U.S. Appl. No. 61/058,494, filed Jun. 3, 2008, 66 pages.
McKenney , et al., "Design considerations for a background limited 350 micron pixel array using lumped element superconducting microresonators" , SPIE, Sep. 24, 2012, 10 pages.
Miller , "A Single-Flux-Quantum Demultiplexer," IEEE Transactions on Applied Superconductivity 7(2):2690-2692, 1997.
Miller , et al., "A Single-Flux-Quantum Demultiplexer," IEEE Transactions on Applied Superconductivity 7(2):2690-2692, 1997.
Niepce, D. , "Fabrication and Characterisation of Thin-Film Superconducting Nanowire Superconductors for Novel Quantum Devices", Master's Thesis in Nanoscience, Chalmers University of Technology, ISSN 1652-8557, 2014, 66 pages.
Semenov , et al., "Classical and Quantum Operation Modes of the Reversible Logic Circuits," Department of Physics and Astronomy, Stony Brook University, Stony Brook, New York, Presentation, Dec. 2006, 29 pages.
Bocko et al., "Prospects for Quantum Coherent Computation Using Superconducting Electronics," IEEE Transactions on Applied Superconductivity 7(2):3638-3641, Jun. 1997.
Bordier et al., "Superconducting Coplanar Switch and Phase Shifter for CMB Applications," J Low Temp Phys, 2016, 7 pages.
Brennen et al., "Why should anyone care about computing with anyons?," arXiv:0704.2241v1 [quant-ph], pp. 1-12, Apr. 18, 2007.
Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.
Bunyk et al., "Architectural Considerations in the Design of a Superconducting Quantum Annealing Processor," IEEE Trans. Appl. Supercond., 24, No. 4, Aug. 2014, 10 pages.
Bunyk et al., "RSFQ Technology: Physics and Devices", World Scientific International Journal of High Speed Electronics and Systems, vol. 11, No. 01, pp. 257-305 (2001).

(56) References Cited

OTHER PUBLICATIONS

Butcher, J.R., "Advances in Persistent-Current Qubit Research: Inductively Coupled Qubits and Novel Biasing Methods," Final Report, Delft University of Technology, Jan. 14, 2002, 52 pages.
Campbell, T. et al., "Dynamics of Oxidation of Aluminum Nanoclusters using Variable Charge Molecular-Dynamics Simulations on Parallel Computers," Physical Review Letters, vol. 82, No. 24, Jun. 14, 1999, 4 pages.
Chapman, et al. "Design of an On-Chip Superconducting Microwave Circulator with Octave Bandwidth" Phys. Rev. Applied 11, 044048—Published Apr. 16, 2019, 13 pages.
Chinese Office Action dated Jul. 22, 2021 for Chinese Application No. 201980047690.7 in 8 pages.
Choi, "Systems, Devices, and Methods for Analog Processing," U.S. Appl. No. 60/986,554, filed Nov. 8, 2007, 39 pages.
Choudhury, "Handbook of Microlithography, Micromachining and Microfabrication vol. 1: Microlithography", The International Society for Optical Engineering, Bellingham, WA, 1999. (book details provided).
Clarke et al., "Quiet Readout of Superconducting Flux States," Physica Scripta. T102: 173-177, 2002.
Cosmelli, C., "Controllable Flux Coupling for the Integration of Flux Qubits," arXiv:cond-mat/0403690v1 [cond-mat.supr-con]. Mar. 29, 2004, 10 pages.
Deutsch, "Quantum theory, the Church-Turing principle and the universal quantum computer," Appeared in Proceedings of the Royal Society of London A 400: 97-117, 1985.
Dickson et al., "Thermally Assisted Quantum Annealing of a 16-Qubit Problem," Nature Communications, 2013, 6 pages.
Dolan et al., "Optimization on the NEOS Server," from SIAM News 35(6): 1-5, Jul./Aug. 2002.
English translation of Office Action mailed Sep. 30, 2022, in JP App No. 2021-149531, 10 pages.
Farhi et al., "Quantum Adiabatic Evolution Algorithms versus Simulated Annealing," MIT-CTP #3228, arXiv:quant-ph/0201031 v1, pp. 1-16, Jan. 8, 2002.
Feynman, "Simulating Physics with Computers," International Journal of Theoretical Physics 21(6/7): 467-488, 1982.
Filippov et al., "Tunable Transformer for Qubits Based on Flux States," IEEE Transactions on Applied Superconductivity 13(2): 1-4, Jun. 2003.
First Office Action dated Oct. 14, 2022 for CN 2020-519439, English translation, 4 pages.
First Office Action issued in Chinese No. 2017800268619 with English translation, Mailed Date: Sep. 6, 2022, 12 pages.
Fourer et al., "Optimization as an Internet Resource," Interfaces 31(2): 130-150, Mar.-Apr. 2001.
Friedman et al., "Quantum superposition of distinct macroscopic states," Nature 406:43-46, Jul. 6, 2000.
Fritzsch et al., "SNS and SIS Josephson junctions with dimensions down to the sub-um region prepared by an unified technology," Supercond. Sci. Tech. 12: 880-882, 1999.
Fukushima, A. et al., "Attenuation of Microwave Filters for Single-Electron Tunneling Experiments," IEEE Transactions on Instrumentation and Measurement, 46(2):289-293, 1997.
Gao, Jiansong, "The Physics of Superconducting Microwave Resonators," Thesis, In Partial Fulfillment of the Requirements for the Degree of Doctor of Philosophy, California Institute of Technology Pasadena, California, May 28, 2008, 197 pages.
Ghiu et al., "Asymmetric two-output quantum processor in any dimension," arXiv:quant-ph/0610138v1, pp. 1-8, Oct. 17, 2006.
Harris et al., "Sign and Magnitude Tunable Coupler for Superconducting Flux Qubits," arXiv:cond-mat/0608253v1 [cond-mat.supr-con], Aug. 11, 2006. 5 pages.
Harris, "Systems, Devices, and Methods for Controllably Coupling Qubits," U.S. Appl. No. 12/017,995, filed Jan. 22, 2008, 33 pages.
Hillery et al., "Approximate programmable quantum processors," arXiv:quant-ph/0510161v1, pp. 1-7, Oct. 20, 2005.
Hioe and Goto, Quantum Flux Parametron—A Single Quantum Flux Superconducting Logic Device, World Scientific Publishing Co. Pte. Ltd., Singapore, pp. 23-43, 1991.
Il'ichev et al., "Continuous Monitoring of Rabi Oscillations in a Josephson Flux Qubit," Physical Review Letters 91(9):097906-1-097906-4, week ending Aug. 29, 2003.
International Preliminary Report on Patentability for PCT/US2017/030857, mailed Nov. 6, 2018, 11 pages.
International Search Report and Written Opinion for PCT/US2019/032689 mailed Sep. 16, 2019, 13 pages.
International Search Report for PCT/US2017/030857, mailed Jul. 24, 2017, 3 pages.
International Search Report, mailed Mar. 18, 2008, for PCT/CA2007/002192, 4 pages.
J. Aumentado, 2020, IEEE Microwave Magazine 20(4), Dec. 2020, 18 pages.
Johnson et al., "Scalable Control System for a Superconducting Adiabatic Quantum Optimization Processor," Superconductor Science & Technology (2010).
Jones et al., "Highly Controllable Qubit-Bath Coupling Based on a Sequence of Resonators," arXiv:1304.4829v2 [cond-mat.mes-hall] Sep. 27, 2013, 14 pages.
Jones et al., "Tunable electromagnetic Environment for Superconducting Quantum Bits," arXiv: 1320.3824v5 [cond-mat.mes-hall] Jun. 13, 2013, 11 pages.
Kaiser et al., "Coherent Atomic Matter Waves: Proceedings of the Les Houches Summer School, Session LXXII in 1999," Springer-Verlag, New York, ISBN 286883499X, pp. 184-188, 294-295, 302-303.
Kerckhoff, et al., "On-Chip Superconducting Microwave Circulator from Synthetic Rotation", Phys. Rev. Applied 4, 034002—Published Sep. 10, 2015, 15 pages.
Koch et al., "Model for 1/f Flux Noise in SQUIDs and Qubits," pp. 1-14, May 5, 2007.
Lee et al., "Investigation of the Dependences of the Attenuation Properties of Cryogenic Metal-Powder Filters on the Preparation Method", Springer, Apr. 18, 2018.
Lee et al., "Study on the fabrication of low-pass metal powder filters for use at cryogenic temperatures", Springer, Aug. 18, 2016.

* cited by examiner

SYSTEMS AND METHODS FOR DUTY CYCLE COMPENSATION OF A DIGITAL TO ANALOG CONVERTER (DAC)

FIELD

This disclosure generally relates to temperature stabilization of electronic devices, and in particular, to systems and methods for temperature stabilization of control circuitry for analog computers.

BACKGROUND

Hybrid Computing System Comprising a Quantum Processor

A hybrid computing system can include a digital computer communicatively coupled to an analog computer. In some implementations, the analog computer is a quantum computer, and the digital computer is a classical computer.

The digital computer can include a digital processor that can be used to perform classical digital processing tasks described in the present systems and methods. The digital computer can include at least one system memory which can be used to store various sets of computer- or processor-readable instructions, application programs and/or data.

The quantum computer can include a quantum processor that includes programmable elements such as qubits, couplers, and other devices. The qubits can be read out via a readout system, and the results communicated to the digital computer. The qubits and the couplers can be controlled by a qubit control system and a coupler control system, respectively. In some implementations, the qubit and the coupler control systems can be used to implement quantum annealing on the analog computer.

Refrigeration

Temperature is a property that can have a significant impact on the state and evolution of a physical system. For example, a superconducting material acts as a superconductor if it is cooled below a critical temperature that is characteristic of the specific material in question. For this reason, those of skill in the art will appreciate that a computer system that implements superconducting processors may implicitly include a refrigeration system to cool the superconducting materials in the system.

Throughout this specification and the appended claims, the term "cryogenic" is used to refer to the temperature range of 0K to about 93K. A variety of technologies may be implemented to produce an environment with cryogenic temperature, though a commonly used device that is known in the art is the helium-3-helium-4 dilution refrigerator, also referred to simply as a dilution refrigerator. Dilution refrigerators can be used to achieve extreme cryogenic temperatures below 50 mK.

Some components of quantum computers may be cryogenically refrigerated, such as the processor, and to have these components in communication with room temperature electronics, such as external control systems that may be accessed by a user for processes such as programming, calibration, and readout. The interaction between cryogenic components and room temperature components may be a source of noise, or errors, in the use of a quantum processor.

Electrical Signal Filtering

During transmission, an electrical signal typically comprises a plurality of components each transmitting at a different frequency. The "filtering" of an electrical signal typically involves the selective removal of certain frequencies from the electrical signal during transmission. Such filtering may be accomplished "passively" or "actively." A passive electrical filter is one that operates without additional power input; that is, the filtering is accomplished by the natural characteristics of the materials or devices through which the electrical signal is transmitted. Passive filters include filters that implement lumped elements such as inductors and capacitors, collectively referred to as lumped element filters (LEFs).

Simple, passive lumped element filters include low-pass and high-pass filters. A low-pass filter is one that substantially filters out higher frequencies and substantially allows lower frequencies to pass through. Conversely, a high-pass filter is one that substantially filters out lower frequencies and substantially allows higher frequencies to pass through. The concepts of low-pass and high-pass filters may be combined to produce "band-pass" filters, which effectively transmit a given range of frequencies and filter out frequencies that fall outside (above and below) of that range. Similarly, "band-stop" filters may be implemented which effectively transmit most frequencies and filter out frequencies that fall inside a given range.

Input to a Quantum Computer

Qubits may be analog devices driven by analog inputs. As described in "Architectural considerations in the design of a superconducting quantum annealing processor" (Bunyk et al., 2014; preprint arXiv1401.5504v1, 21 Jan. 2014; also published in IEEE Transactions on Applied Superconductivity (Volume: 24, Issue: 4, August 2014)), when qubits are integrated into a single chip in large numbers, it may become impractical to precisely control all qubits with dedicated analog input lines. Instead, as described in that paper, on-chip Digital-to-Analog Converters (DACs) may be used to provide input to the qubits and couplers. A particular implementation described in that paper is referred to as a flux DAC, or Φ-DAC. This Φ-DAC in turn receives signals from room temperature electronics. In this document, the term Φ-DAC is used to refer to the on-chip flux DACs, and the term DAC is used generally to refer to the room temperature electronics. However, it will be understood that both devices may be referred to as DACs, and the context would be understood by a person of skill in the art.

These Φ-DACs are essentially digital. However, these input signals to the Φ-DACs have particular shapes that are formed via an analog process, and for example could be formed by generating them with a further Digital-to-Analog Converter (DAC) at room temperature. Some of the controls are digital with sufficient margins to be unaffected by minor errors in the input. However, others have lower operating margins, so need to be stable after operating levels are calibrated. There are many purely analog controls on the quantum computer as well. For example, in some implementations, the control lines that implement an annealing schedule across a plurality of qubits provide analog signals.

Where analog circuitry of the quantum computer is driven directly from inputs from room temperature circuitry, these inputs may be generated by a DAC at room temperature. In an implementation of a quantum computer input as disclosed in US patent application publication no. 20210057631, one or more inputs to the processor may be supplied by one or more DACs at room temperature.

Digital-to-Analog Conversion and Temperature Stability

In order to convert digital signals in the digital computer into analog signals to be supplied to a quantum computer, at least one Digital-to-Analog Converter (DAC) is used. DACs may be present outside of a cryogenic refrigerator containing a low-temperature chip containing the quantum computer. The DAC or DACs may be, for example, at room temperature. DACs may also be present in the fridge or on the low-temperature chip itself. This document is primarily directed to the DAC or DACs outside the fridge, also referred to as the room temperature electronics.

Stability and accuracy of the analog control signals produced by the DAC directly affect precision of the quantum computer. Hardware temperature stability may affect stability and accuracy of DAC output signals.

Known solutions for stabilizing DACs include connecting hardware to heat sinks which are cooled, e.g., by forced air circulation; submerging components in non-conducting coolant fluid with a low boiling temperature; reducing temperature dependency by using components that either have no temperature dependency or have internal compensation of it; and automatically adjusting temperature-related change with feedback loops, either analog or in software.

External or software feedback loop temperature stabilization typically cannot act on a sufficient timescale to compensate for short term self-heating effects. Furthermore, with several temperature-dependent components of the hardware, software feedback compensation for differential heating of components is limited by thermalization of parts of the DAC board. Of the external temperature stabilization methods, submerging the hardware into boiling non-conducting coolant fluid with a low boiling temperature provides the best results, but makes production, installation, and service complicated and costly. Design of self-adjusting hardware with an analog feedback loop can be technically challenging and may involve balancing contradictory concerns such as dissipation of the device or output noise characteristics. Reduction of temperature dependency of DAC output by using components that either have no temperature dependency or have internal compensation is not always possible. One of the most temperature dependent components is semiconductor switches which can be replaced by a gold-plated relay at a cost of significant (10-100×) increase in the hardware dimensions or reduction in functionality (a single DAC range instead of 8 ranges, etc.).

Therefore, there is a desire for improved temperature stabilization for Digital-to-Analog Converters (DACs). It will be understood that while the context of quantum computers is discussed below, temperature stabilization may also be of use in areas where DACs are used other than to provide input signals to a quantum computer.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

This proposal describes how to improve DAC hardware temperature stability and as such controlled device precision. Changes to hardware inputs can affect hardware temperature, and the hardware temperature can affect the stability of outputs from the hardware. For example, differential heating of components may have a significant effect on output control signal stability and accuracy. In a complex multi-user system, especially with long idle periods interlacing with short intervals of time with the highest power output, hardware temperature may vary significantly.

Therefore, temperature-stabilization techniques can beneficially be used to reduce temperature dependency effects from self-heating and duty-cycle.

According to an aspect, there is provided a computer system comprising a digital computer, a digital-to-analog converter (DAC) communicatively coupled to the digital computer to receive digital input and having an analog signal output, a principal load communicatively coupled to the analog signal output, an auxiliary load communicatively coupled to the analog signal output, and at least one switch communicatively coupled to the analog signal output, the principal load, and the auxiliary load, the at least one switch operable to connect and disconnect the principal load from the analog signal output, the auxiliary load arranged to receive an analog signal from the analog signal output when the principal load is disconnected from the analog signal output of the DAC, wherein in use the digital computer supplies digital input to the DAC both when the principal load is connected to the analog signal output of the DAC and when the principal load is disconnected from the analog signal output of the DAC.

According to other aspects, the auxiliary load may be arranged electrically in parallel with the principal load to receive the analog signal from the analog signal output while the principal load is connected to the analog signal output of the DAC, the analog signal from the analog signal output may be an output current, the principal load and the auxiliary load together may receive the analog signal from the analog signal output when the principal load is connected to the analog signal output, the auxiliary load may comprise a shunt resistor, the shunt resistor may be a termination resistor, the termination resistor may be located on a transmission line from the DAC to the principal load, the analog signal from the analog signal output may be a differential signal output comprising a pair of opposite analog signal outputs, and the shunt resistor may connect between opposite analog signal outputs of the pair, the digital computer may supply the digital input to the DAC to cause the DAC to produce as the analog signal from the analog signal output a first waveform of a characteristic shape when the analog signal output is connected to the principal load, and when the analog signal output is not connected to the principal load, the digital computer may supply the digital input to the DAC to cause the DAC to produce as the analog signal output a second waveform of the characteristic shape, the principal load may comprise a portion of a quantum computer system, the portion of the quantum computer system may comprise a portion of an arrangement of on chip control circuitry on a processor chip of a quantum computer, and the arrangement of on chip control circuitry may be communicatively coupled to supply analog inputs to the quantum computer, when the principal load is disconnected from the analog signal output, the digital computer may cause an adjustment of the digital input to the DAC to adjust an amplitude of the analog signal from the analog signal output of the DAC to compensate for a change in dissipation from analog components of the DAC resulting from the disconnection of the principal load from the analog signal output, the digital computer may cause an adjustment of the digital input to the DAC to adjust the amplitude of the analog signal from the analog signal output of the DAC by a factor equal to a ratio between a first overall resistance faced by the DAC when the principal load is connected to the DAC to a second overall resistance faced by the DAC when the principal load is not connected to the DAC, the digital computer may supply the digital input to the DAC to cause the DAC to produce as the analog signal from the analog signal output a first waveform of a characteristic shape when the analog signal output is connected to the principal load, and when the analog signal output is not connected to the principal load, the digital computer supplies the digital input to the DAC to cause the DAC to produce as the analog signal of the analog signal output a second waveform of the characteristic shape.

According to an aspect, there is provided a method of operation in a system that includes a digital-to-analog converter (DAC), a digital computer and an analog computer, the digital computer communicatively coupled to the DAC to provide digital input to the DAC, and the DAC selectively communicatively coupled to the analog computer to provide analog output from the DAC to the analog computer, the method comprising operating the DAC, by the digital computer, to produce a first analog output from the DAC while the analog computer is connected to the DAC, disconnecting the analog computer from the DAC by at least one switch such that an auxiliary resistance is connected to the DAC, and operating the DAC, by the digital computer, to provide a second analog output from the DAC while the analog computer is disconnected from the DAC.

According to other aspects, the method may further comprise adjusting the digital input to the DAC by the digital computer to adjust an amplitude of the analog output of the DAC to at least partially compensate for a change in dissipation from analog components of the DAC resulting from the disconnection of the DAC from the analog output, determining an adjustment digital input to the DAC to at least partially compensate for a change in dissipation from analog components of the DAC resulting from the disconnection of the DAC from the analog output, and adjusting the digital input to the DAC based at least in part of the determination, connecting an auxiliary resistance to the analog output of the DAC to at least partially compensate for change in dissipation from analog components of the DAC resulting from the disconnection of the DAC from the analog output, wherein connecting the analog computer to the DAC may comprise connecting the analog computer to the DAC electrically in parallel with an auxiliary resistance that is electrically coupled to the analog output of the DAC, and determining an adjustment digital input to the DAC to at least partially compensate for a change in dissipation from an auxiliary resistance that is electrically coupled to the analog output of the DAC, and adjusting the digital input to the DAC based at least in part of the determination.

In other aspects, the features described above may be combined together in any reasonable combination as will be recognized by those skilled in the art.

A computer system may include a digital-to-analog converter (DAC) having an analog signal output, a switch operable to connect and disconnect a first load (e.g., principal load) from the analog signal output of the DAC, and a digital computer communicatively coupleable or connected to supply digital input to the DAC both when the first or principal load is connected to the analog signal output of the DAC and when the first or principal load is disconnected from the analog signal output of the DAC. In at least some implementations, digital input can be a digital representation of an analog waveform, for instance using a 16-bit integer or real number representation. The first or principal load can be all or a portion of a computer system, for example an analog computer system, for instance a quantum computer system. The digital computer may be communicatively coupled or connected and operable to control the switch. The computer system may include a second load (e.g., auxiliary load) arranged to receive the analog signal output when the first or principal load is disconnected from the analog signal output of the DAC. The auxiliary load can serve as a substitute or replacement load to at least partially or completely substitute or replace the first or principal load, and/or serve as a compensation load to at least partially or completely compensate the removal of the first or principal load via decoupling or disconnection from the from the analog signal output of the DAC. The analog signal output may be an output current. In at least some implementations, the first or principal load and the second or auxiliary load may both together receive the analog signal output when the first or principal load is connected to the analog signal output. The second or auxiliary load may be a shunt resistor. The shunt resistor may be a termination resistor. The termination resistor may be located on a transmission line from the DAC to the first or principal load, substantially adjacent to the first or principal load. The analog signal output may be a differential signal output comprising a pair of opposite analog signal outputs, and the shunt resistor may connect between the opposite analog signal outputs of the pair. When the first or principal load is disconnected from the analog signal output, the digital computer may cause an adjustment of the digital signal input to the DAC to adjust an amplitude of the analog signal output of the DAC to at least in part or wholly compensate for a change in dissipation from analog components of the DAC resulting from the disconnection of the first or principal load from the analog signal output. The digital computer may cause an adjustment of the digital signal input to the DAC to adjust the amplitude of the analog signal output of the DAC by a factor equal to a ratio between a first overall resistance faced by the DAC when the first or principal load is connected to the DAC to a second overall resistance faced by the DAC when the first or principal load is not connected to the DAC. The digital computer may supply the digital input to the DAC to cause the DAC to produce as the analog signal output a first waveform of a characteristic shape when the analog signal output is connected to the first or principal load, and when the analog signal output is not connected to the first or principal load, the digital computer can supply the digital input to the DAC to cause the DAC to produce, as the analog signal output, a second waveform of substantially the same characteristic shape. The first or principal load can be a portion of or all of a quantum computer system. The portion of the quantum computer system may be a portion of an arrangement of further digital-to-analog converters on a chip containing a quantum computer, the arrangement of further digital-to-analog converters being arranged to supply analog inputs to the quantum computer.

A method of operation in a system is described, the system including a digital-to-analog converter (DAC), a digital computer and an analog computer, the DAC being connected to the digital computer to provide digital input to the DAC, and being connected to the analog computer to provide analog output from the DAC to the analog computer. The method can include disconnecting the analog computer from the DAC, operating the DAC, by the digital computer, to produce a first analog output from the DAC while the analog computer is disconnected from the DAC; connecting the analog computer to the DAC; and the operating the DAC, by the digital computer, to provide a second analog output from the DAC while the analog computer is connected to the DAC. When the analog computer is disconnected from the DAC, the digital computer, can adjust the digital input to the DAC to adjust an amplitude of the analog signal output of the DAC to at least partially or wholly compensate for a change in dissipation from analog components of the DAC resulting from the disconnection of the first or principal load from the analog signal output. The method can also include determining an adjustment digital input to the DAC to at least partially compensate for a change in dissipation from analog components of the DAC resulting from the disconnection of the DAC from the analog output.

This approach may be of particular use in control systems which benefit from high stability and precision of analog control signals and suffer from duty-cycle related to self-heating and hardware component temperature dependencies of the complete electronic assembly. In a quantum computer, processor accuracy may be limited by variation in heating from control signal DACs, and using an idle or auxiliary load to keep heating constant may be beneficial.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with digital computer systems with digital processors, analog computer systems including quantum computer systems with quantum processors and readout subsystems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure, or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Figure 1:
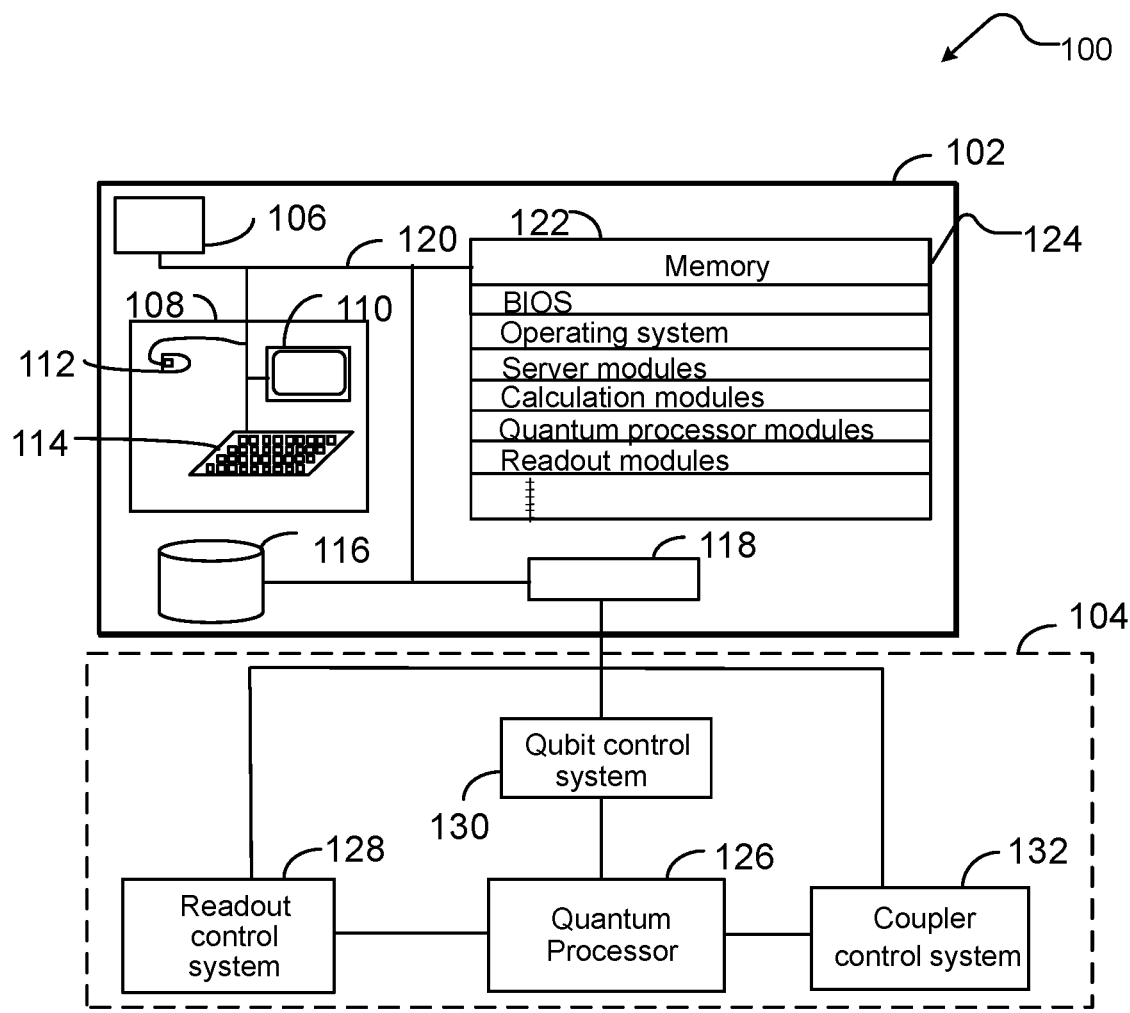
FIG. 1 is a schematic diagram of an example hybrid computing system including a digital computer connected to an analog computer, in accordance with the present systems, devices, and methods.

FIG. 1 illustrates a computing system 100 comprising a digital computer 102. The example digital computer 102 includes one or more digital processors 106 that may be used to perform classical digital processing tasks. Digital computer 102 may further include at least one system memory 122, and at least one system bus 120 that couples various system components, including system memory 122 to digital processor(s) 106. System memory 122 may store one or more sets of processor-executable instructions, which may be referred to as modules 124.

The digital processor(s) 106 may be any logic processing unit or circuitry (for example, integrated circuits), such as one or more central processing units ("CPUs"), graphics processing units ("GPUs"), digital signal processors ("DSPs"), application-specific integrated circuits ("ASICs"), programmable gate arrays ("FPGAs"), programmable logic controllers ("PLCs"), etc., and/or combinations of the same.

In some implementations, computing system 100 comprises an analog computer 104, which may include one or more quantum processors 126. Quantum processor 126 may include at least one superconducting integrated circuit. Digital computer 102 may communicate with analog computer 104 via, for instance, a controller 118. Certain computations may be performed by analog computer 104 at the instruction of digital computer 102, as described in greater detail herein.

Digital computer 102 may include a user input/output subsystem 108. In some implementations, the user input/output subsystem includes one or more user input/output components such as a display 110, mouse 112, and/or keyboard 114.

System bus 120 may employ any known bus structures or architectures, including a memory bus with a memory controller, a peripheral bus, and a local bus. System memory 122 may include non-volatile memory, such as read-only memory ("ROM"), static random-access memory ("SRAM"), Flash NAND; and volatile memory such as random-access memory ("RAM") (not shown).

Digital computer 102 may also include other non-transitory computer- or processor-readable storage media or non-volatile memory 116. Non-volatile memory 116 may take a variety of forms, including: a hard disk drive for reading from and writing to a hard disk (for example, a magnetic disk), an optical disk drive for reading from and writing to removable optical disks, and/or a solid state drive (SSD) for reading from and writing to solid state media (for example NAND-based Flash memory). Non-volatile memory 116 may communicate with digital processor(s) via system bus 120 and may include appropriate interfaces or controllers 118 coupled to system bus 120. Non-volatile memory 116 may serve as long-term storage for processor- or computer-readable instructions, data structures, or other data (sometimes called program modules or modules 124) for digital computer 102.

Although digital computer 102 has been described as employing hard disks, optical disks and/or solid-state storage media, those skilled in the relevant art will appreciate that other types of nontransitory and non-volatile computer-readable media may be employed. Those skilled in the relevant art will appreciate that some computer architectures employ nontransitory volatile memory and nontransitory non-volatile memory. For example, data in volatile memory may be cached to non-volatile memory or a solid-state disk that employs integrated circuits to provide non-volatile memory.

Various processor- or computer-readable and/or executable instructions, data structures, or other data may be stored in system memory 122. For example, system memory 122 may store instructions for communicating with remote clients and scheduling use of resources including resources on the digital computer 102 and analog computer 104. Also, for example, system memory 122 may store at least one of processor executable instructions or data that, when executed by at least one processor, causes the at least one processor to execute the various algorithms to execute instructions. In some implementations system memory 122 may store processor- or computer-readable calculation instructions and/or data to perform pre-processing, co-processing, and post-processing to analog computer 104. System memory 122 may store a set of analog computer interface instructions to interact with analog computer 104. For example, the system memory 122 may store processor- or computer-readable instructions, data structures, or other data which, when executed by a processor or computer causes the processor(s) or computer(s) to execute one, more or all of the acts of the methods described below, such as method 500 described with respect to FIG. 5.

The digital computer 102 may comprise one or more digital computers.

Analog computer 104 may include at least one analog processor such as quantum processor 126. Analog computer 104 may be provided in an isolated environment, for example, in an isolated environment that shields the internal elements of the quantum computer from heat, magnetic field, and other external noise. The isolated environment may include a refrigerator, for instance a dilution refrigerator, operable to cryogenically cool the analog processor, for example to temperature below approximately 1 K.

Analog computer 104 may include programmable elements such as qubits, couplers, and other devices (also referred to herein as controllable devices). Qubits may be read out via readout system 128. Readout results may be sent to other computer- or processor-readable instructions of digital computer 102. Qubits may be controlled via a qubit control system 130. Qubit control system 130 may include on-chip Digital to Analog Converters (Φ-DACs) and analog lines that are operable to apply a bias to a target device. Couplers that couple qubits may be controlled via a coupler control system 132. Coupler control system 132 may include tuning elements such as on-chip DACs and analog lines. Qubit control system 130 and coupler control system 132 may be used to implement a quantum annealing schedule as described herein on analog computer 104. Programmable elements may be included in quantum processor 126 in the form of an integrated circuit. Qubits and couplers may be positioned in layers of the integrated circuit that comprise a first material. Other devices, such as readout control system 128, may be positioned in other layers of the integrated circuit that comprise a second material. In accordance with the present disclosure, a quantum processor, such as quantum processor 126, may be designed to perform quantum annealing and/or adiabatic quantum computation. Examples of quantum processors are described in U.S. Pat. No. 7,533,068.

The interfaces and controllers 118 may include, for example, one or more Digital to Analog Converters (DACs). Each DAC may produce an analog signal output to send to the analog computer 104. The analog signal output may be, for example, an output current, as current is needed as input to implementations of the analog computer. In other industries the output is typically voltage.

In an example, the DAC used may comprise plural DACs used together to achieve greater precision than a single DAC. These plural DACs may individually be conventional DACs. In one implementation, output from a Maxim Integrated™ 5884 14-bit DAC is summed with attenuated output from an Analog Devices™ AD9748 8 bit DAC to obtain, after calibration and relying on the disclosures of the present application, for example 16 bits of precision. This high level of precision, beneficial for quantum computing, results in any given level of analog error having a more significant effect than with a lower precision DAC.

Outputting current may make a DAC more complex and more prone to heating effects, due for example to higher current in the DAC and lower resistance from the connected load. As used herein, "load" (also principal load and auxiliary load) refers to an electrical load (e.g., a resistive, capacitive, or inductive load). The DAC may, for example, contain resistors that heat due to the current, but when current does not flow there is no heating, which causes variation in the temperature of the circuit. The variation in heating can cause control errors. In an example, the output current may be produced by using a voltage DAC and converting the output to current by measuring line resistance. However, this measurement depends on temperature, which causes errors.

The analog signal output of the DAC typically provides control signals to on chip control circuitry of analog computer 104 intermittently. Therefore, conventionally the digital computer will not cause the DAC to produce the analog signal output when the analog signal output is not in use, as additional analog signals may be disruptive to the operation of the analog computer 104 or may be an unnecessary use of power. This is shown schematically in FIG. 2. In an initial time period 200, no analog signal is output from the DAC. In a subsequent time period 202, an analog signal is provided to the analog computer, and the digital computer causes (e.g., triggers, requests) the DAC to output a waveform to the analog computer, the outputted waveform schematically indicated by waveform 206. In a subsequent (e.g., final) time period 204, again no analog signal is output from the DAC. The behavior shown in FIG. 2 leads to temperature changes in the DAC over time. At the beginning of time period 202, the components of the DAC, or other components of the control line between the DAC and the analog computer, will be at least relatively cool as these components have not been active during time period 200. As time period 202 progresses, the components will relatively heat up due to activity during time period 202 as the waveform 206 is outputted. This may affect the output of the DAC.

Figure 3:
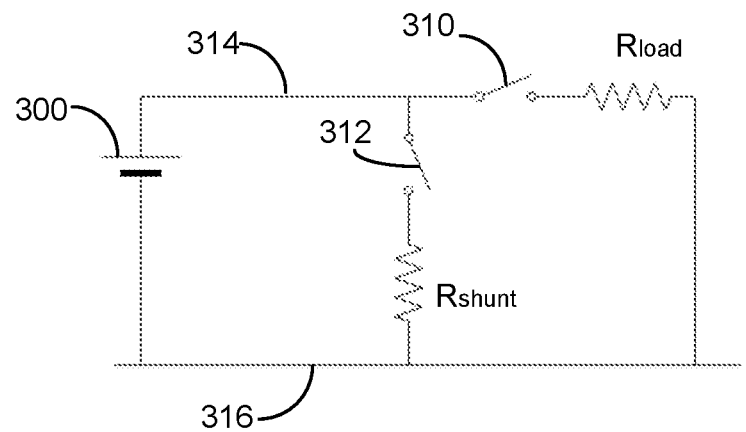
FIG. 3 is a schematic circuit diagram representing selected components of an example circuit for implementing a temperature stabilization technique.

To address this issue, it can be beneficial to cause the DAC to continue to generate an output signal while output to the analog computer is not needed to reduce temperature dependency effects from self-heating and duty-cycle. Providing an auxiliary load allows for switching between the processor chip as a first or principal load and a second or auxiliary load (e.g., resistor), which may facilitate keeping the temperature constant or substantially constant during operations. Instead of turning the signal from the DAC ON and OFF and having temperature fluctuation, the signal from the DAC is switched between communicating with the first or principal load (e.g., a chip including a quantum computer or portion thereof) and the second or auxiliary load (e.g., a resistor, separate and distinct from first or principal load). An example implementation of DAC 300 is shown schematically in FIG. 3 as a direct current (DC) source, but may also, depending on the implementation, take the form of an alternating current (AC) source. To avoid disrupting the analog computer, a switch 310 may be provided as shown in FIG. 3, the switch 310 operable to communicatively couple (e.g., connect) and disconnect the first or principal load (in this case, the analog computer) from the analog signal output of the DAC. The switch 310 is in some instances referred to as a first or principal switch since the state of switch 310 controls whether or not the first or principal load (e.g., analog computer or portion thereof) is coupled to the analog signal output of the DAC 300. The switch 310 can, for example, take the form of an enable/disable multiplexer. In FIG. 3, the portion of the analog computer which is normally supplied with the output of the DAC is schematically indicated by a lumped resistance $R_{load}$. The digital computer is connected and/or operable to supply digital input to the DAC both when the first or principal load is connected to the analog signal output of the DAC and when the first or principal load is disconnected from the analog signal output of the DAC. A DAC may also be used to provide output to other devices that act as first or principal loads in addition or in lieu of an analog computer, and the teachings of the present disclosure may be applied to such other devices. The first or principal load may be a portion of a quantum computer system. In an example, the portion of the quantum computer system is a portion of an arrangement of on-chip control circuitry on a processor chip of a quantum computer, the arrangement of on-chip control circuitry being arranged to supply analog inputs to the quantum computer. In an example implementation, the DAC 300, and all components of FIG. 3 other than $R_{load}$, are implemented on a circuit board.

Especially where the DAC provides a current as output, the DAC may advantageously employ a closed circuit through which to provide the output. This closed circuit may include a second or auxiliary load arranged to receive the analog signal output when the first or principal load ($R_{load}$) is disconnected from the analog signal output of the DAC, the second or auxiliary load illustrated in FIG. 3 as a shunt resistor $R_{shunt}$. A second or auxiliary switch 312 is coupled and operable to connect or disconnect the second or auxiliary load (e.g., shunt resistor). In an implementation, the shunt resistor may be connected when the analog computer is disconnected, in order to provide a substitute or replacement or compensation load to the DAC. In such an implementation, the shunt resistor can, for example, be selected to have a resistance matching that of the first or principal load, so that the DAC will output the same resistance value as during normal operation (e.g., when coupled to the first or auxiliary load) and no adjustment of the digital input to the DAC is needed to make dissipation within the DAC match that experienced in normal operation.

In a further implementation, the second or auxiliary load, illustrated in FIG. 3 as a shunt resistor $R_{shunt}$, is a pre-existing or integral component of the computing system 100. The second or auxiliary load may, for example, receive the analog signal from the DAC together with the first or principal load when the second or auxiliary load is connected, for example, in parallel with the first or principal load, or in series with the first or principal load. The second or auxiliary switch 312 may be omitted in the parallel loads implementation. In this case, the collective resistance of the first or principal load together with the second or auxiliary load will not be the same as the second or auxiliary load alone, resulting in the output from the DAC experiencing a different level of resistance when the analog computer is connected to the DAC than when the analog computer is disconnected from the DAC.

Electrical conductors 314 and 316 (e.g., electrically conductive circuit traces, electrically conductive wires, interchangeably referred to as lines), alone or together with additional components (not shown) may form a transmission line. The additional components, if present, may be components of the DAC or further components, for example of a filter (not shown). The shunt resistor $R_{shunt}$ may be for example a termination resistor for the transmission line formed by electrical conductors 314 and 316. Where the shunt resistor is coupled in parallel with the first or principal load (first or primary switch 310 and second or auxiliary switch 312 of FIG. 3 both in closed state), the resistor may be an end termination resistor. An end termination resistor may be located substantially adjacent to the first or principal load, where "adjacent" refers not to physical position but logical position in terms of circuit elements. Electrical conductors 314 and 316 may, depending on the implementation, be an output line of the DAC and a ground return (which may be omitted), or a pair of opposite analog signal outputs, together forming a differential signal output of the DAC. The shunt resistor may connect between the opposite analog signal outputs of the pair of opposite analog signal outputs.

The operation of the DAC where the first or principal load is connected to the output of the DAC may be referred to as "control mode", and where the first or principal load is disconnected from the output of the DAC may be referred to as "idle mode". Where the output from the DAC experiences a different level of resistance when the first or principal load (e.g., analog computer) is connected to the DAC than when the first or principal load is disconnected from the DAC, this may, depending on the DAC, result in different levels of heat dissipation in the control mode than the idle mode. Components of the DAC or other control line components may experience increased heating when the first or principal load is connected to the output of the DAC. In order to compensate for this change in heating, the digital input to the DAC provided by the digital computer may be adjusted in order to provide an output that will compensate for this change in heating. The digital input to the DAC may be adjusted, for example, to cause a selection of components to have the same power dissipation in the idle mode as in the control mode. For example, where the main effect of the heating is due to the overall current flow, an increase in resistance due to disconnecting the analog computer from being in parallel with the shunt resistor may reduce the current flow, and the digital input to the DAC may be increased in order to at least partially compensate for the change. For example, for some DACs, the signals may be scaled according to the ratio of the overall load resistances faced by the DAC in order to keep the overall current flow, and thus $I^2R$ (that is, current squared multiplied by the resistance) heating the same. In an example, this may allow dissipation of all components of the board, except the shunt resistor, to remain constant. In particular, any components in series with the DAC, regardless of the state of switch 310, may receive the same heating in both circumstances. This may include, depending on the DAC implementation, one or more analog output resistors and one or more output multiplexers in series with the analog output resistor(s). On the other hand, any components that are in series with the DAC only in one state of the switch 310 may receive different heating. This may include, for example, components of switch 310 itself, which can, for example, take the form of an enable/disable multiplexer. Thus, when the enable/disable multiplexer is turned ON and OFF to divert the output signal away from the device under test when in the "idle" state, the output is disabled and currents may be routed to the on board shunt resistor. However, it may be beneficial to maintain other components at a consistent temperature. By measuring device power consumption and temperature in control mode and idle mode and comparing these values between control and idle modes, additional scaling factor corrections can be calculated to achieve a better match between control mode and idle mode. In an example, a complete match in temperatures between control and idle mode may be obtained. In other examples, temperature differences between control and idle mode may be substantially reduced. Such additional corrections may also be applied even if no initial scaling factor was applied, for example if a dedicated resistor was switched to the dedicated resistor matching the resistance of the first, or principal, load.

Figure 2:
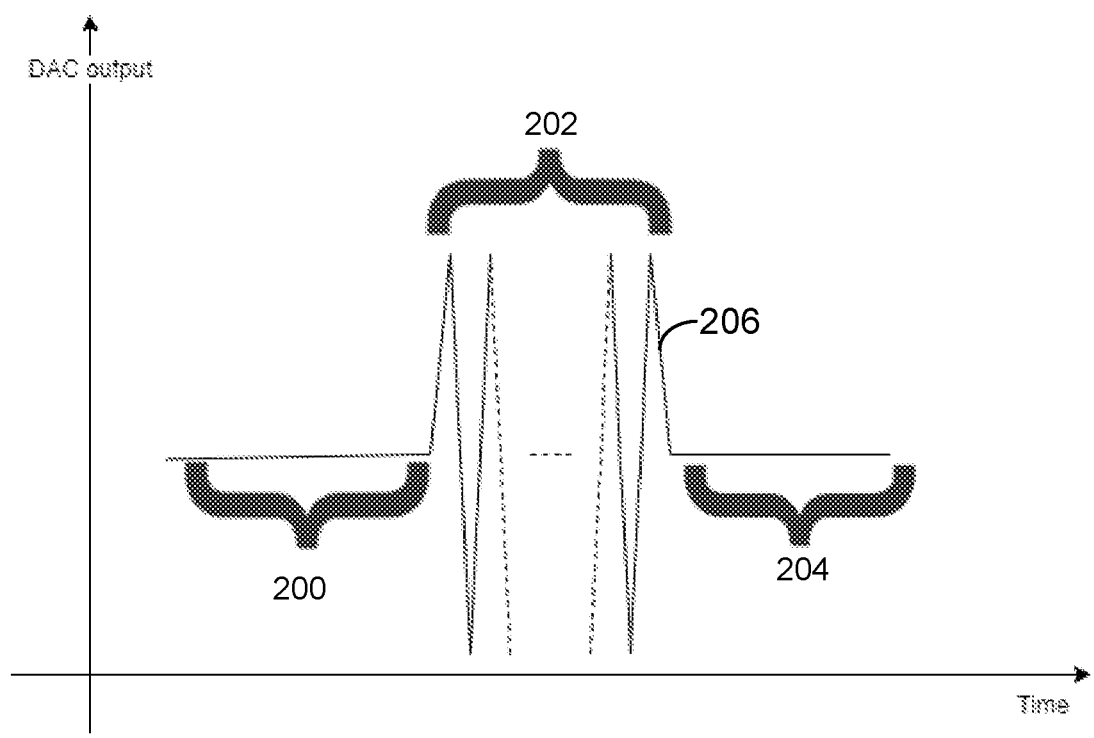
FIG. 2 is a schematic graph showing exemplary DAC output without implementing a temperature stabilization technique.
Figure 4:
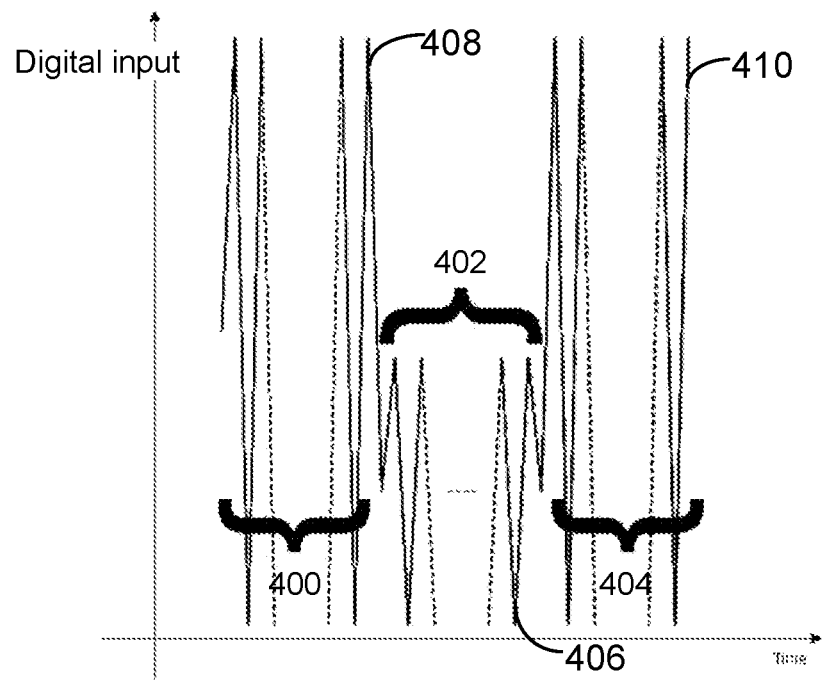
FIG. 4 is a schematic graph showing exemplary digital input to a DAC implementing the temperature stabilization technique.

This compensation is illustrated in FIG. 4. FIG. 4 shows an example implementation of digital input to the DAC over time, where the value of the digital input corresponds to the analog output that the given digital input would typically result in; where the response of the DAC is linear this may be the binary value of the digital input. In FIG. 2, time periods 200, 202 and 204 are shown. Similar time periods 400, 402, and 404 are shown in FIG. 4. Where the analog computer is connected, for example in an intermediary (e.g., middle) time period 402, digital input 406 corresponds to the analog output waveform 206 shown in FIG. 2. However, in time periods 400 and 404, where the analog computer is not connected, inputs 408 and 410 are provided which would normally correspond to a much larger analog output, in order to compensate for the change in resistance. These inputs may be provided continuously during the idle mode. The digital computer may be connected to supply the digital input to the DAC to cause the DAC to produce as the analog signal output a first waveform of a characteristic shape when the analog signal output is connected to the first or principal load. When the analog signal output is not connected to the first or principal load (e.g., analog computer), the digital computer may be connected to supply the digital input to the DAC to cause the DAC to produce as the analog signal output a second waveform of substantially the same characteristic shape regardless of any difference in amplitude. Keeping the same shape may help keep the same time dependence of any temperature changes and may help keep the calculation carried out by digital components of the DAC similar, so their heating will also be close to that in the control mode. Depending on the implementation, in the control mode, inputs may be provided that are different than one another. Maintaining the waveform shape in the idle mode may also include such varied inputs as experienced in the control mode if applicable, or a single waveform may be output repeatedly. A repeated single waveform may be an exemplary typical waveform or a designed exercise waveform to mimic typical thermal effects of the control mode.

In another example, a series of inputs may be recorded in the control mode, then continuously played back, during the idle mode either unmodified or with adjustments such as scaling. The digital computer could alternatively simulate the control mode and produce digital input to the DAC based on the simulation, unmodified from the simulated digital inputs or with adjustments such as scaling.

Where a shunt resistor is connected, regardless of whether the first or primary load (e.g., analog computer) is connected to the DAC or not, and the shunt resistor is in parallel with the first or primary load when the first or primary load is connected to the DAC, maintaining the same overall current flow will result in heating in the shunt resistor. This may be acceptable, for example, if the shunt resistor has low sensitivity to temperature, low resistance and thus low heating compared to other elements, faster cooling than other elements, or if the current received by the analog computer is not particularly sensitive to the resistance of the shunt resistor in comparison to other components.

Figure 5:
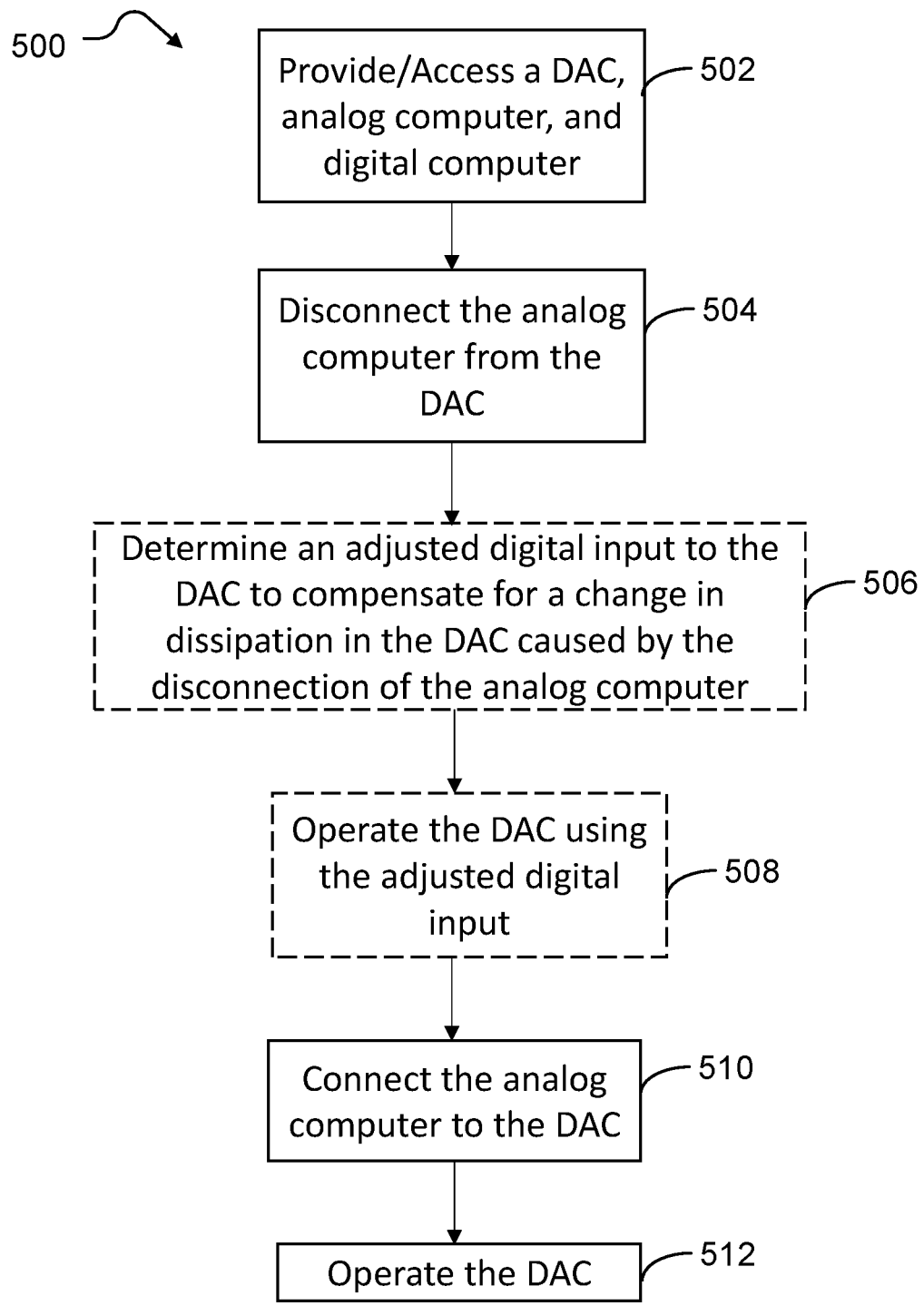
FIG. 5 is a flow chart illustrating an example temperature stabilization technique.

FIG. 5 is a flow chart illustrating an exemplary method 500. In act 502, a Digital-to-Analog Converter (DAC), analog computer and digital computer are provided or accessed. The DAC may be communicatively coupled to the digital computer, which provides digital input to the DAC and communicatively coupled to the analog computer to provide analog output from the DAC to the analog computer. In act 504, the analog computer is communicatively uncoupled from the DAC, for example by operating a switch (e.g., first or primary switch 310 of FIG. 3). In optional act 506, the digital computer adjusts or cause an adjustment of the digital signal input to the DAC to adjust an amplitude of the analog signal output of the DAC to compensate for a change in dissipation from analog components of the DAC, the change in dissipation resulting from the communicative uncoupling of the first or principal load (i.e., the analog computer) from the analog signal output. In some implementations, method 500 may include determining an adjustment digital input to the DAC. This change in dissipation may be, for example, due to a change in amplitude, such that the digital input provides a compensating change in amplitude. In an example, the digital computer adjusts the digital signal input to the DAC to adjust the amplitude of the analog signal output of the DAC by a factor equal to a ratio between a first overall resistance faced by the DAC when the first or principal load is communicatively coupled to the DAC to a second overall resistance faced by the DAC when the principal load is not communicatively coupled to the DAC. In act 508, the DAC is operated by the digital computer while the analog computer is communicatively uncoupled from the DAC, using the adjusted digital input if act 506 was executed. In act 510, the analog computer is communicatively coupled to the DAC, and in act 512, the DAC is operated by the digital computer with the analog computer connected to the DAC.

The system and method described herein can perform self-heating testing and temperature compensation, using an on-board termination resistor and a board output switch of a circuit board including the DAC to continue waveform playback while disconnected from the fridge and the quantum processor unit (QPU).

A typical DAC includes multiple components which are switched based on digital input. A typical DAC also includes one or more analog inputs, which may be constant reference inputs. Depending on the design of the DAC, the components of the DAC may be switched between different lines so that each component is active regardless of the digital input to the DAC.

All switches shown may be controlled, for example, by the digital computer. The digital computer may comprise one or more digital computers with one or more processors and memory or other nontransitory storage media, one which may for example control a switch and another which may provide digital input to the DAC, and which may coordinate digitally.

The temperature stabilization techniques described here may be used in conjunction with other methods, for example, the temperature stabilization methods discussed in the background above. The methods described herein are beneficially targeted to fast changes of temperature due to self-heating which cannot be mitigated by thermalization and temperature compensation. For example, software compensation for temperature of components by adjusting the digital input to the DAC to attempt to keep the output constant, may be combined with the techniques described here. Where both techniques used involve adjusting the digital input to the DAC, a combined adjustment may be formed, for example by multiplication of adjustment ratios or addition of adjustment deltas of the different techniques.

Figure 6:
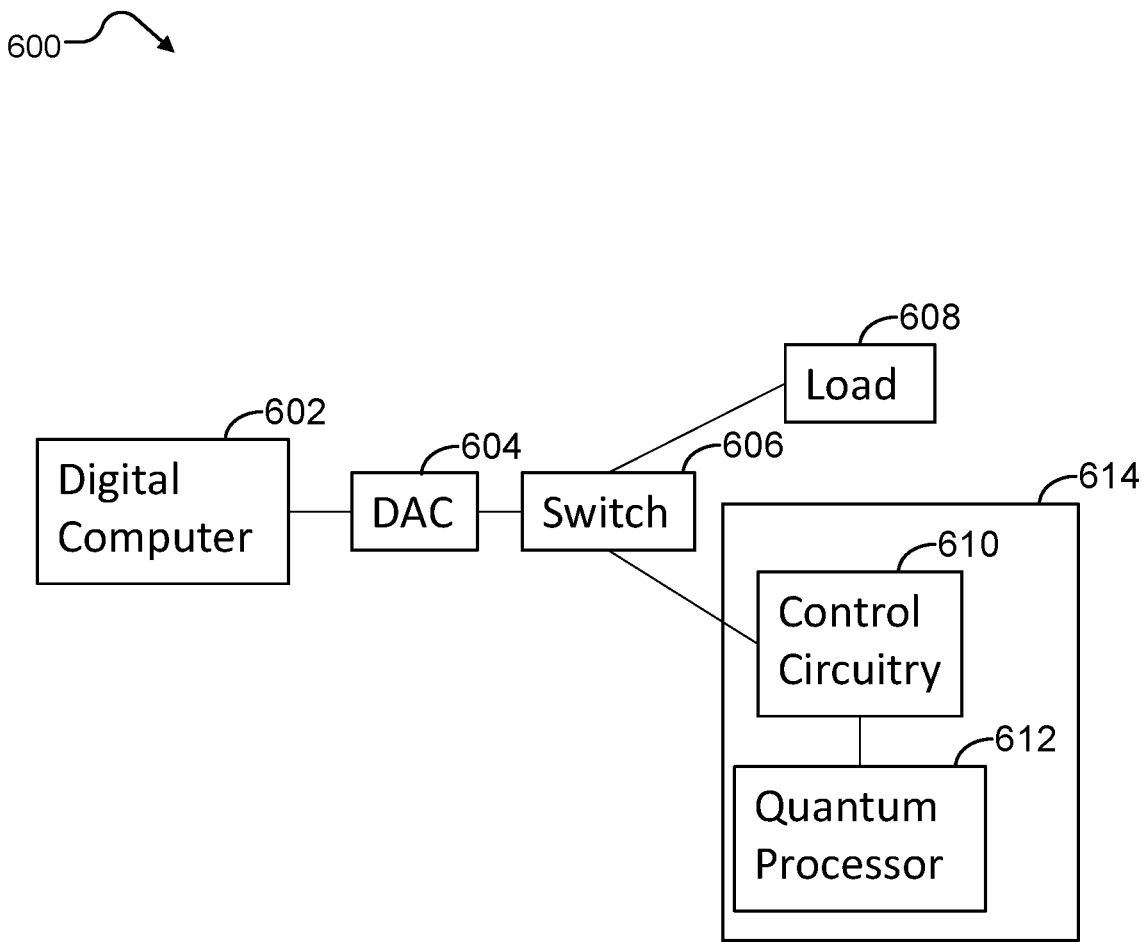
FIG. 6 is a schematic of an example system for controlling components of a quantum processor.

FIG. 6 is a schematic of an example computer system 600 communicatively coupled and operable to control components of a quantum processor as discussed above. Computer system 600 has a digital computer, such as digital computer 102 discussed above with reference to FIG. 1, and a quantum processor 612, such as quantum processor 126 discussed above. Control circuitry 610, such as qubit control system 130 and coupler control system 132 may be provided in communication with quantum processor 126. Control circuitry 610 and quantum processor 612 may form part of a quantum processor, such as quantum processor 104 of FIG. 1. In the example implementation of FIG. 6, control circuitry 610 receives analog signals from one or more digital to analog converters (DAC) 604 that receive digital signals from digital computer 602 and converts them to analog signals and provides the analog signals to control circuitry 610. That is, digital computer 602 supplies digital input to DAC 603, and DAC 604 supplies analog input to switch 606. The output of DAC 604 communicates through switch 606, which may take the form of switches 310 and 312 as discussed above with reference to FIG. 3. As discussed in further detail above, switch 606 (which may be formed from multiple physical switches such as 310, 312) provides a control signal to control circuitry 610 when such a control signal is used to interact with quantum processor 612. For example, when programming biases on on-chip DACs, qubits, couplers, or other devices, one or more analog signals can be provided to control circuitry 610 to perform such programming. Similarly, analog signals may be provided during quantum evolution, during readout, during calibration, or at other times during the use of quantum processor 612. When control signals are not being passed to control circuitry 610, the control signals are switched to communicate with load 608. Load 608 may be provided by an auxiliary load circuit as discussed above with respect to FIG. 3, and may be referred to as an auxiliary load. In the example implementation of FIG. 6, auxiliary load 608 and principal load 614 (e.g., quantum computer 614) are communicatively coupled separately to switch 606, however, they may also be connected in series or in other arrangements. As discussed above, in some implementations, while switch 606 connects and disconnects a signal from control circuitry 610, load 608 may be continuously connected, while in other implementations the signal may disconnect from load 608 when connected with control circuitry 610.

As discussed above, in use, quantum processors typically employ a high degree of accuracy in control signals in order to perform accurate calculations. In particular, where multiplexing is used, each device may be addressed by a particular signal on the same control line. Further, when programming on-chip flux DACs, a high degree of accuracy in programming signals may provide a high degree of accuracy when using the on-chip flux DACs. Temperature fluctuations can be caused by variable heat, or thermal, dissipation from DAC hardware, such as DAC 604, if the DAC experiences idle periods intermittently with high power output intervals. Such temperature fluctuations may result in inaccurate signals. This may then result in inaccuracies during use of the quantum processor, and result in increased error rates of computations. As described herein, consistent thermal dissipation from DACs can be provided by switching a control signal from communication with control circuitry (e.g., 610) to communication with an auxiliary load (e.g., 608) instead of turning off the control signal. It will be understood that the signal may be varied in magnitude between communication with 610 and communication with 608, but will be continuous in order to reduce temperature fluctuations. While in conventional circuitry it is typical to disconnect control signals when no longer in use, as this saves power, in example implementations described herein it may be beneficial to maintain a constant electrical load and transfer signal to an auxiliary load when not in use in communication with the processor. In some implementations, the digital computer may provide a continuous signal to the DAC, and the DAC may in turn provide a continuous analog output. That is, the signal provided by the DAC to the control circuitry of the quantum computer is preferably effectively non-zero during operation of the quantum processor. While the magnitude of the signal may change in response to the switching, as discussed in further detail above, the signal is preferably effectively non-zero for the duration of the operation of the quantum processor. That is, the signal is not switched OFF for the duration of the operation. Effectively non-zero as used herein is intended to refer to a signal that is not turned OFF during operation, however, is not intended to exclude signals that pass instantaneously through zero as part of a continuous wave form (e.g., a signal imposed on a sine wave carrier). Preferably, the signal is both effectively non-zero and of a magnitude sufficient to maintain similar or identical heat dissipation such that the control signal may be programmed accurately, and the performance of the quantum processor is not detrimentally impacted by temperature fluctuations. In other words, the DAC is supplied with, and therefore supplies, a continuous, effectively non-zero signal that is switched between communication with a quantum computer and/or the control circuitry thereof, and an auxiliary load. The magnitude of this signal may be consistent throughout, such as where the auxiliary load is designed to generate similar heat dissipation from the DAC to the quantum computer, or the magnitude of the signal may vary with the switching in order to generate similar heat dissipation in both states. While this effectively non-zero signal during operation of the quantum computer requires a higher power output than turning ON and OFF the signal as needed, in the context of a quantum computer this continuous, effectively non-zero signal can preferentially reduce signal variation due to heating in analog control signals communicating with quantum computers.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to:

U.S. Pat. Nos. 7,533,068; 8,279,022; 9,231,181; 9,762,200; 10,097,151; and 10,468,793.

US published patent application number 20210057631.

U.S. provisional patent application Nos. 63/275,068; 61/080,996; 61/080,997; 61/110,382; and 62/888,605.

Bunyk et al, "Architectural Considerations in the Design of a Superconducting Quantum Annealing Processor", IEEE Transactions on Applied Superconductivity (Volume: 24, Issue: 4, August 2014), and the corresponding preprint arXiv1401.5504v1, 21 Jan. 2014, are also incorporated by reference in their entirety.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A computer system comprising:
a digital computer;
a digital-to-analog converter (DAC) communicatively coupled to the digital computer to receive digital input and having an analog signal output;
a principal load communicatively coupled to the analog signal output;
an auxiliary load communicatively coupled to the analog signal output; and
at least one switch communicatively coupled to the analog signal output, the principal load, and the auxiliary load, the at least one switch operable to connect and disconnect the principal load from the analog signal output, the auxiliary load arranged to receive an analog signal from the analog signal output when the principal load is disconnected from the analog signal output of the DAC;
wherein in use the digital computer supplies digital input to the DAC both when the principal load is connected to the analog signal output of the DAC and when the principal load is disconnected from the analog signal output of the DAC, and
wherein, when the principal load is disconnected from the analog signal output, the digital computer causes an adjustment of the digital input to the DAC to adjust an amplitude of the analog signal from the analog signal output of the DAC to compensate for a change in dissipation from analog components of the DAC resulting from the disconnection of the principal load from the analog signal output.

2. The computer system of claim 1 wherein the auxiliary load is arranged electrically in parallel with the principal load to receive the analog signal from the analog signal output while the principal load is connected to the analog signal output of the DAC.

3. The computer system of claim 1 wherein the analog signal from the analog signal output is an output current.

4. The computer system of claim 1 wherein the principal load and the auxiliary load together receive the analog signal from the analog signal output when the principal load is connected to the analog signal output.

5. The computer system of claim 1 wherein the auxiliary load comprises a shunt resistor.

6. The computer system of claim 5 wherein the shunt resistor is a termination resistor.

7. The computer system of claim 6 wherein the termination resistor is located on a transmission line from the DAC to the principal load.

8. The computer system of claim 5 wherein the analog signal from the analog signal output is a differential signal output comprising a pair of opposite analog signal outputs, and the shunt resistor connects between opposite analog signal outputs of the pair.

9. The computer system of claim 1 wherein the digital computer supplies the digital input to the DAC to cause the DAC to produce as the analog signal from the analog signal output a first waveform of a characteristic shape when the analog signal output is connected to the principal load, and when the analog signal output is not connected to the principal load, the digital computer supplies the digital input to the DAC to cause the DAC to produce as the analog signal output a second waveform of the characteristic shape.

10. The computer system of claim 1 wherein the principal load comprises a portion of a quantum computer system.

11. The computer system of claim 10 wherein the portion of the quantum computer system comprises a portion of an arrangement of on chip control circuitry on a processor chip of a quantum computer, the arrangement of on chip control circuitry communicatively coupled to supply analog inputs to the quantum computer.

12. The computer system of claim 1 wherein the digital computer causes an adjustment of the digital input to the DAC to adjust the amplitude of the analog signal from the analog signal output of the DAC by a factor equal to a ratio between a first overall resistance faced by the DAC when the principal load is connected to the DAC to a second overall resistance faced by the DAC when the principal load is not connected to the DAC.

13. The computer system of claim 1 wherein the digital computer supplies the digital input to the DAC to cause the DAC to produce as the analog signal from the analog signal output a first waveform of a characteristic shape when the analog signal output is connected to the principal load, and when the analog signal output is not connected to the principal load, the digital computer supplies the digital input to the DAC to cause the DAC to produce as the analog signal of the analog signal output a second waveform of the characteristic shape.

14. A method of operation in a system that includes a digital-to-analog converter (DAC), a digital computer and an analog computer, the digital computer communicatively coupled to the DAC to provide digital input to the DAC, and the DAC selectively communicatively coupled to the analog computer to provide analog output from the DAC to the analog computer, the method comprising:
  operating the DAC, by the digital computer, to produce a first analog output from the DAC while the analog computer is connected to the DAC;
  disconnecting the analog computer from the DAC by at least one switch such that an auxiliary resistance is connected to the DAC; and
  operating the DAC, by the digital computer, to provide a second analog output from the DAC while the analog computer is disconnected from the DAC; and
  adjusting the digital input to the DAC by the digital computer to adjust an amplitude of the analog output of the DAC to at least partially compensate for a change in dissipation from analog components of the DAC resulting from the disconnection of the DAC from the analog output.

15. The method of claim 14 further comprising: determining an adjustment digital input to the DAC to at least partially compensate for a change in dissipation from analog components of the DAC resulting from the disconnection of the DAC from the analog output, and adjusting the digital input to the DAC based at least in part of the determination.

16. The method of claim 14 further comprising: connecting an auxiliary resistance to the analog output of the DAC to at least partially compensate for change in dissipation from analog components of the DAC resulting from the disconnection of the DAC from the analog output.

17. The method of claim 14 wherein connecting the analog computer to the DAC comprises connecting the analog computer to the DAC electrically in parallel with an auxiliary resistance that is electrically coupled to the analog output of the DAC.

18. The method of claim 17 further comprising: determining an adjustment digital input to the DAC to at least partially compensate for a change in dissipation from an auxiliary resistance that is electrically coupled to the analog output of the DAC, and adjusting the digital input to the DAC based at least in part of the determination.

* * * * *